United States Patent
Rivera et al.

(10) Patent No.: US 10,224,262 B2
(45) Date of Patent: Mar. 5, 2019

(54) FLEXIBLE HEAT SPREADER LID

(71) Applicant: GLOBALFOUNDRIES Inc., Grand Cayman (KY)

(72) Inventors: Kathryn C. Rivera, Hopewell Junction, NY (US); Janak G. Patel, South Burlington, VT (US); David Stone, Jericho, NY (US); Samantha Donovan, Annapolis, MD (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/593,969

(22) Filed: May 12, 2017

(65) Prior Publication Data

US 2018/0331011 A1 Nov. 15, 2018

(51) Int. Cl.
*H01L 23/36* (2006.01)
*H01L 23/367* (2006.01)
*H01L 23/552* (2006.01)
*H01L 23/00* (2006.01)

(52) U.S. Cl.
CPC .......... *H01L 23/3675* (2013.01); *H01L 23/36* (2013.01); *H01L 23/552* (2013.01); *H01L 23/562* (2013.01)

(58) Field of Classification Search
CPC . H01L 23/552; H01L 23/3672; H01L 23/562; H01L 23/367; H01L 23/3675; H01L 23/36; H01L 23/49568
See application file for complete search history.

(56) References Cited

U.S. PATENT DOCUMENTS

| | | | |
|---|---|---|---|
| 6,215,180 B1 * | 4/2001 | Chen | H01L 23/36 257/675 |
| 6,882,041 B1 | 4/2005 | Cheah et al. | |
| 6,906,413 B2 | 6/2005 | Bish et al. | |
| 6,919,630 B2 * | 7/2005 | Hsiao | H01L 23/10 257/625 |
| 8,018,072 B1 | 9/2011 | Miks et al. | |
| 8,278,743 B2 | 10/2012 | Fukuda et al. | |
| 8,519,529 B2 * | 8/2013 | Ogihara | H01L 21/563 257/704 |
| 8,736,048 B2 | 5/2014 | Schultz | |
| 2006/0091509 A1 * | 5/2006 | Zhao | H01L 23/04 257/678 |
| 2013/0206363 A1 | 8/2013 | Kirk et al. | |
| 2014/0061893 A1 * | 3/2014 | Saeidi | H01L 23/16 257/712 |
| 2014/0374897 A1 * | 12/2014 | Zhao | H05K 1/0203 257/713 |

OTHER PUBLICATIONS

Taiwan Intellectual Property Office, Examination Report issued in Application No. 107108259 dated Oct. 2, 2018 and English translation thereof.

* cited by examiner

*Primary Examiner* — Jasmine Clark
(74) *Attorney, Agent, or Firm* — Thompson Hine LLP; Anthony Canale

(57) ABSTRACT

Heat spreader lids and package assemblies including a heat spreader lid. The heat spreader lid has a central region configured to be coupled with an electronic component, a peripheral region configured to be coupled with a substrate, and a connecting region arranged between the central region and the peripheral region. The connecting region is configured to impart stress relief to the central region.

20 Claims, 2 Drawing Sheets

FLEXIBLE HEAT SPREADER LID

BACKGROUND

The present invention generally relates to semiconductor manufacturing and, more particularly, relates to heat spreader lids and package assemblies including a heat spreader lid.

Industry practice in the field of semiconductor packaging is to mount a semiconductor chip or chip stack to a package substrate composed of a laminate or organic material, such as an epoxy resin. The chip or chip stack generates heat when powered in operation. Thermal management of the package may require some type of thermal management mechanism mounted to the chip or chip stack to extract and dissipate the generated heat. Absent effective heat dissipation, the generated heat can reduce chip performance, decrease reliability, and reduce the useful lifetime of the chip.

One type of thermal management solution is a heat spreader lid disposed in thermal contact with an exterior surface of the semiconductor chip or chip stack. Conventional heat spreader lids have a solid, continuous surface with uniform thickness. This surface of the heat spreader lid may be adhered to the chip with a thermally conductive layer of material. The heat spreader lid may also include a flange that is adhered to the substrate with an adhesive, which may be electrically conductive.

As the size of the semiconductor chip and the substrate increase such that the package size increases, the package may become increasingly prone to warpage, cracking and delamination due to thermal and mechanical stress at the chip-to-package interface. In particular, cracking may be observed at and near the corners of the packaged chip.

Improved heat spreader lids and package assemblies including a heat spreader lid are needed.

SUMMARY

In an embodiment of the invention, a structure includes a heat spreader lid having a central region configured to be coupled with an electronic component, a peripheral region configured to be coupled with a substrate, and a connecting region arranged between the central region and the peripheral region. The connecting region is configured to impart stress relief to the central region.

In an embodiment of the invention, a package assembly includes an electronic component, a substrate, and a heat spreader lid having a central region, a peripheral region with a flange, and a connecting region arranged between the central region and the peripheral region. The connecting region is configured to impart stress relief to the central region. The package assembly may further include an adhesive layer connecting the flange with the substrate and/or a thermal interface layer connecting the central region of the heat spreader lid with the electronic component.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
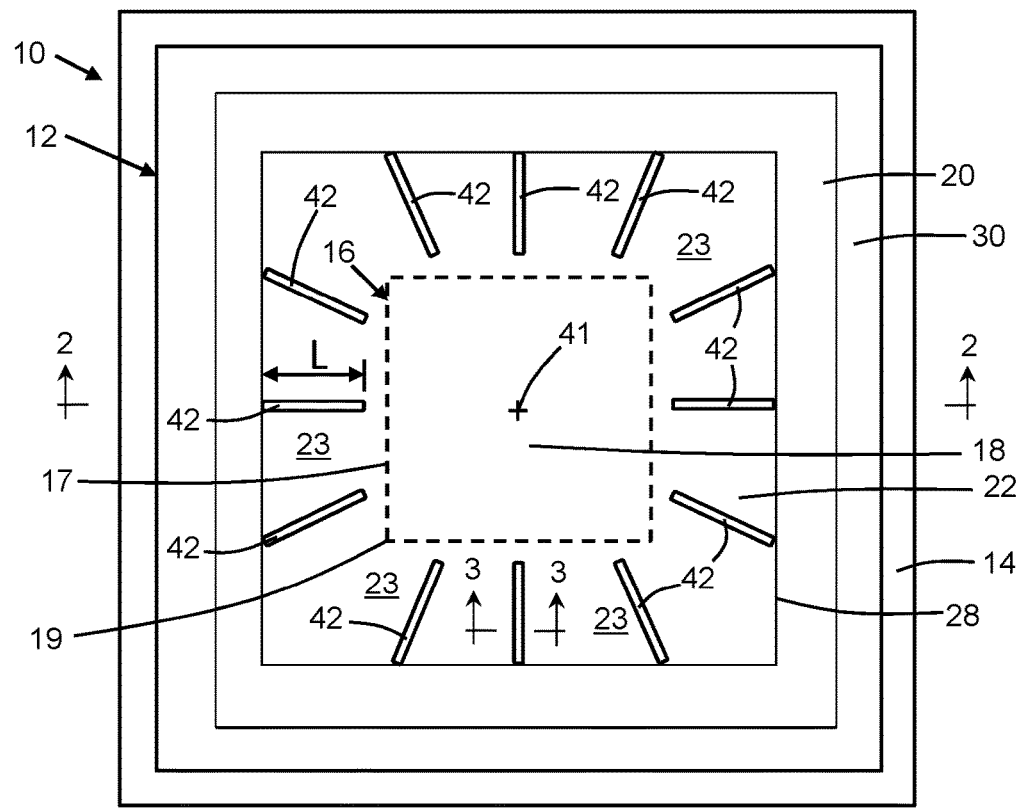
FIG. 1 is a top view of a package assembly in accordance with embodiments of the invention.
Figure 2:
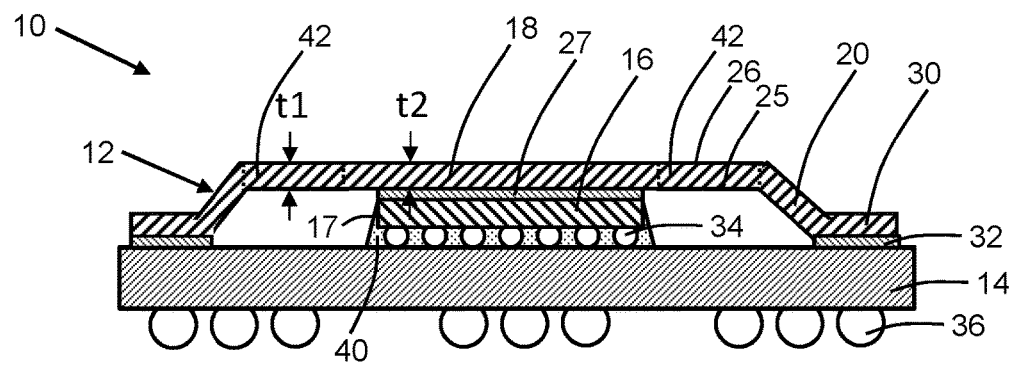
FIG. 2 is a cross-sectional view of the package assembly taken generally along line 2-2 in FIG. 1.
Figure 3:
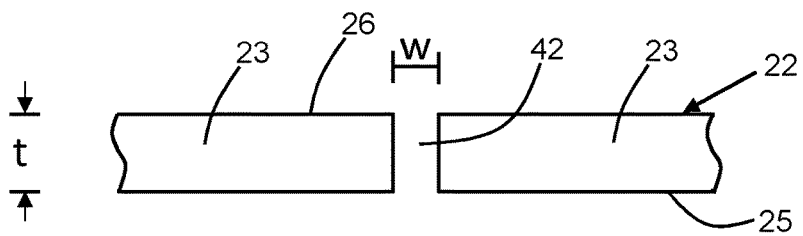
FIG. 3 is a cross-sectional view of the package assembly taken generally along line 3-3 in FIG. 1.

With reference to FIGS. 1, 2, 3 and in accordance with embodiments of the invention, a package assembly 10 further includes a heat spreader lid 12 and a laminate substrate 14 that are assembled with a chip or die 16 serving as a representative electronic component. The laminate substrate 14 may be composed of a laminate or organic material, such as an epoxy resin. The die 16 may include one or more integrated circuits with device structures fabricated using front-end-of-line (FEOL) processes, and may be encapsulated inside a block composed of a cured molding compound. The FEOL processes may comprise, for example, complementary-metal-oxide-semiconductor (CMOS) processes used to build a combination of p-type and n-type field-effect transistors that are coupled to implement logic gates and other types of digital circuits. In an embodiment, the die 16 may be a relatively large chip, such as a chip with a linear dimension of twenty-two (22) mm or larger, which produces a relatively large package assembly 10. The die 16 includes side edges 17 that intersect at corners 19 so as to establish an outer boundary or perimeter of the die 16.

The heat spreader lid 12 includes a central region 18 that is coupled over a surface area inside of the side edges 17 with the die 16 by a thermal interface material layer 27. The heat spreader lid 12 further includes a peripheral region 20 and a connecting region 22 that connects the central region 18 with the peripheral region 20. The peripheral region 20 and connecting region 22 encircle or surround the central region 18 with the connecting region 22 arranged between the peripheral region 20 and the central region 18. The peripheral region 20 and connecting region 22 intersect and adjoin at an outer perimeter 28 of the connecting region 22.

The connecting region 22 includes a surface 25 that faces toward the laminate substrate 14 and die 16, and another surface 26 that is opposite to the surface 25 and is separated from the surface 25 by the thickness, t1, of the connecting region 22. Due to the area differential, the side edges 17 of the die 16 are offset inside an outer perimeter 28 of the connecting region 22. The surfaces 25, 26 extend from the outer perimeter 28 of the connecting region 22 to the side edges 17 defining the outer boundary of the die 16.

The peripheral region 20 is shaped to provide a vertical offset that permits the peripheral region 20 to be connected with the laminate substrate 14 while accommodating the connection of the die 16 to the central region 18 of the heat spreader lid 12. The peripheral region 20 may include a flange 30 that is mechanically connected to the laminate substrate 14 by an adhesive layer 32, which may also be electrically conductive. The attachment of the flange 30 to the laminate substrate 14 adds mechanical strength to the package assembly 10, and a conductive path to the laminate substrate 14.

The heat spreader lid 12 is composed of an electrically conductive and thermally conductive material, such as copper coated with nickel. The thermal interface material layer 27 may be effective to reduce the contact resistance between the mating heat-generating and heat-sinking units by filling micro-gaps located between the mating surfaces. The thermal interface material layer 27 may also function as to assist in the distribution of heat generated by the die 16 across the entire interface between the heat spreader lid 12 and the die 16. The thermal interface material layer 27 may be comprised of a thermal adhesive, a thermal grease, a thermal gel, a phase change material, a thermal pad, or a combination thereof. The thermal resistance of the thermal interface material layer 27 may depend upon, among other factors, contact resistance, bulk thermal conductivity, and layer thickness.

Reflowed solder balls 34 couple bond pads on the die 16 with complementary bond pads on the laminate substrate 14. Bond pads on the laminate substrate 14 may be coupled with complementary bond pads on a printed circuit board (not shown) by solder balls 36. The laminate substrate 14 may also include a ground plane and a power plane used to deliver ground and power potentials to the die 16. An underfill 40 may be applied that fills the open space in the gap between the die 16 and the laminate substrate 14 that is not occupied by the solder balls 34, and may include a filet at the outer edges of the die 16. The underfill 40 protects the reflowed solder balls 34 against various adverse environmental factors, redistributes mechanical stresses due to shock, and prevents the solder balls 34 from moving under strain during thermal cycles when the die 16 is operating in an end use device.

The heat spreader lid 12 operates to extract and dissipate heat generated by the die 16. The thickness and area of the heat spreader lid 12 should be sufficiently large for package warpage control and to functionally spread the heat generated by the die 16. The heat spreader lid 12 also contributes a Faraday shield that is located proximate to a source of electromagnetic interference (EMI) radiation, namely the die 16. The EMI radiation is captured by the heat spreader lid 12 before the EMI radiation can escape from the package assembly 10 to interrupt, obstruct, or otherwise degrade or limit the effective performance of other components on the printed circuit board to which the laminate substrate 14 is attached or to otherwise escape to an exterior of a system box housing the die 16 and laminate substrate 14. In particular, the peripheral region 20 of the heat spreader lid 12 may be grounded through the connection of the flange 30 to the laminate substrate 14 so that the EMI radiation can be dissipated as an electrical current to ground provided by a ground plane in the laminate substrate 14.

The connecting region 22 of the heat spreader lid 12 may include one or more features 42 that, in the representative embodiment, are in the form of through-openings or slits that extend through the full thickness of the connecting region 22. The features 42 may be formed during the manufacturing process (e.g. stamping) used to form the heat spreader lid 12.

In an embodiment, the features 42 in the connecting region 22 may be arranged circumferentially about a center point 41 of the central region 18, and may be aligned with a radial orientation relative to the center point 41. Each of the features 42 has a beginning point and an ending point that is located within the connecting region 22. Adjacent pairs of features 42 are separated by a sector 23 of the connecting region 22. The length of the features 42 is limited such that the features 42 do not intrude into the central region 18 so as to avoid interference with heat extraction and dissipation. To that end, the features 42 may extend relative to the outer perimeter 28 with a length, L, and in respective directions that are transverse to the side edges 17 of the die 16. The respective ending points of the features 42 end short of the location of the side edges 17. The features 42 also have a given width, w, that may be selected with EMI shielding taken into consideration as a design factor. The length and width of the features 42, as well as the number and location of the features 42, are design parameters that may be chosen to impart a given level of stress reduction to the heat spreader lid 12 and, in particular, to the central region 18 that is bonded with the die 16 by the thermal interface material layer 27.

The features 42 in the connecting region 22 are linear in the representative embodiment. In an alternative embodiment, one or more of the features 42 may have a non-linear shape, such as a curved shape or an arc shape. The features 42 are elongated slots in the representative embodiment. In an alternative embodiment, one or more of the features 42 may have a different geometrical shape, such a circular feature 42 that defines a hole extending through the thickness of the connecting region 22.

The thickness, t1, of the connecting region 22 may be uniform or, alternatively, may represent an average thickness that takes minor thickness variations into account. In an alternative embodiment, the thickness, t1, of one or more sectors 23 of the connecting region 22 may be less than the thickness, t2, of the central region 18 inside the side edges 17 of the die 16. Alternatively, the entirety of the connecting region 22 may be thinner than the central region 18, and the features 42 may be omitted with the lower thickness of the connecting region 22 providing stress reduction.

The features 42 may reduce the structural stiffness of the heat spreader lid 12 in comparison with the structural stiffness of conventional heat spreader lids lacking such features. The reduction in structural stiffness may reduce the stress on the corners of the die 16 and the solder balls 34 and underfill 40 beneath the corners of the die 16. Consequently, the connecting region 22 in combination with the one or more features 42 defines a stress reduction region for the central region 18. The reduced structural stiffness increases the flexibility without sacrificing the functions of heat spreading, warpage control, and EMI shielding. The degree of the flexibility increase can be tailored to specific configurations by modifying the parameters and geometry (e.g., width, length, depth, orientation) characterizing the features 42.

Figure 4:
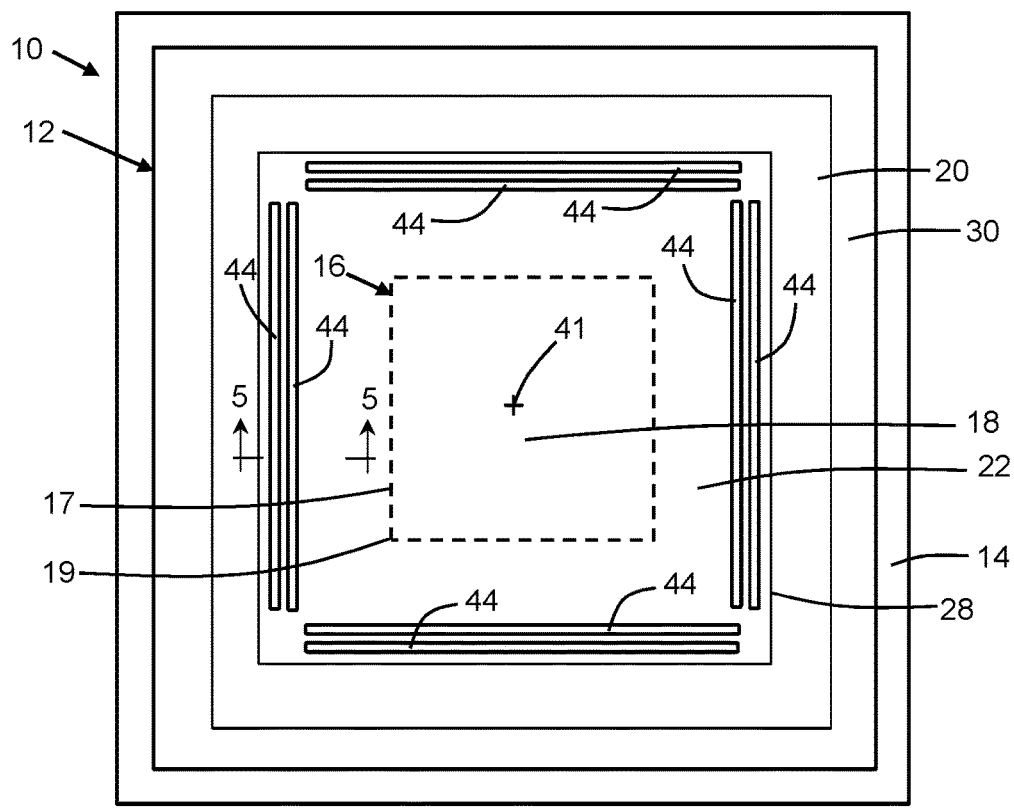
FIG. 4 is a top view of a package assembly in accordance with embodiments of the invention.
Figure 5:
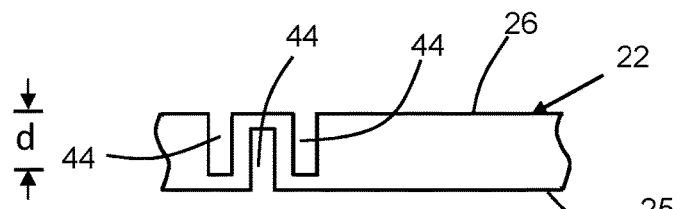
FIG. 5 is a cross-sectional view of the package assembly taken generally along line 5-5 in FIG. 4.

With reference to FIGS. 4, 5 in which like reference numerals refer to like features in FIGS. 2, 3 and in accordance with an alternative embodiment, the heat spreader lid 12 may include one or more features 44 in the connecting region 22 that, in the representative embodiment, are in the form of grooves or channels that do not extend through the full thickness of the connecting region 22 (i.e., are not through openings and are only partial depth). The connecting region 22 in combination with the one or more features 44 defines a stress reduction region. In embodiments, the features 44 may have a depth, d, in a range of greater than or equal to 20% of the thickness of the connecting region 22 and less than or equal to 80% of the thickness of the connecting region 22. In an embodiment, the depth of each feature 44 may be less than or equal to two (2) millimeters.

The features 44 are located in groups between the outer perimeter 28 of the connecting region 22 and the side edges 17 of the die 16. In an embodiment, the features 44 may be distributed on the surface 25 of the connecting region 22 and also on the surface 26 of the connecting region 22 of the heat spreader lid 12. Alternatively, the features 44 may be distributed only on surface 25 or only on surface 26. The features 44 on surface 26 are arranged in parallel pairs with the parallel features 44 being aligned with the side edges 17 of the die 16. The features 44 on surface 25 are also arranged to be aligned parallel with the side edges 17 of the die 16. In the representative embodiment, the features 44 are linear and have an arrangement that is parallel to the side edges 17 of the die 16. For each grouping of features 44, at least one of the features 44 on surface 26 is arranged parallel with at least one of the features 44 on the surface 25.

In an embodiment, the features 44 may have a radial orientation similar to the alignment of features 42 (FIG. 1), and one or more of the features 44 may have a length that extends inwardly past the edges 17 of the die 16 and into the central region 18 of the heat spreader lid 12. Because of the partial-thickness depth, the impact of the features 44 in the central region 18 upon the thermal interface material layer 27 is reduced or absent in comparison with features 42 that are through-openings. For example, the thermal interface material layer 27 may flow into grooves, instead of flowing through through-openings.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a heat spreader lid having a central region configured to be coupled with an electronic component, a peripheral region configured to be coupled with a substrate, a connecting region arranged between the central region and the peripheral region, and one or more openings that extend completely through the connecting region,
   wherein the central region includes a center point, and the one or more openings in the connecting region are aligned radially relative to the center point of the central region and are arranged circumferentially about the center point of the central region.

2. The structure of claim 1 wherein the connecting region surrounds the central region, and the peripheral region surrounds the connecting region and the central region.

3. The structure of claim 1 wherein the one or more openings modify a structural stiffness of the connecting region.

4. The structure of claim 1 wherein at least one of the one or more openings is linear.

5. The structure of claim 1 wherein each of the one or more openings extends transverse to a side edge of the electronic component.

6. The structure of claim 5 wherein each of the one or more openings has a beginning point and an ending point within the connecting region, and the ending point is located outside of the side edge of the electronic component.

7. The structure of claim 1 wherein the one or more openings divide the connecting region into a plurality of sectors, the central region has a first thickness, and at least one of the sectors has a second thickness that is less than the first thickness.

8. A structure comprising:
   a heat spreader lid having a central region configured to be coupled with an electronic component, a peripheral region configured to be coupled with a substrate, and a connecting region arranged between the central region and the peripheral region,
   wherein the connecting region has a thickness, and the connecting region includes one or more grooves that extend partially through the thickness of the connecting region.

9. The structure of claim 8 wherein each of the one or more grooves has a depth that is greater than or equal to 20% of the thickness of the connecting region and that is less than or equal to 80% of the thickness of the connecting region.

10. The structure of claim 8 wherein at least one of the one or more grooves is arranged to extend into the central region.

11. The structure of claim 8 wherein at least one of the one or more grooves is arranged to extend parallel to a side edge of the electronic component.

12. The structure of claim 8 wherein the connecting region includes a first surface and a second surface separated from the first surface by the thickness of the connecting region, at least one of the one or more grooves is located on the first surface, and at least one of the one or more grooves is located on the second surface.

13. The structure of claim 12 wherein the at least one of the one or more grooves on the first surface is arranged to extend parallel to the at least one of the one or more grooves on the second surface.

14. The structure of claim 8 wherein the one or more grooves modify a structural stiffness of the connecting region.

15. A package assembly comprising:
    an electronic component;
    a substrate; and
    a heat spreader lid including a central region, a peripheral region with a flange, and a connecting region arranged between the central region and the peripheral region,
    wherein the connecting region has a thickness, and the connecting region includes one or more grooves that extend partially through the thickness of the connecting region.

16. The package assembly of claim 15 wherein the one or more grooves modify a structural stiffness of the connecting region.

17. The package assembly of claim 15 further comprising:
    a thermal interface layer between the central region of the heat spreader lid and the electronic component.

18. The package assembly of claim 17 further comprising:
    an adhesive layer between the flange and the substrate.

19. The package assembly of claim 15 further comprising:
an adhesive layer between the flange and the substrate.

20. The package assembly of claim 15 wherein the connecting region includes a first surface and a second surface separated from the first surface by the thickness of the connecting region, at least one of the one or more grooves is located on the first surface, and at least one of the one or more grooves is located on the second surface.

\* \* \* \* \*